US010819330B2

(12) United States Patent
Bienvenu

(10) Patent No.: US 10,819,330 B2
(45) Date of Patent: Oct. 27, 2020

(54) ELECTRONIC CIRCUIT

(71) Applicant: STMicroelectronics (Rousset) SAS, Rousset (FR)

(72) Inventor: Philippe Bienvenu, Saint-Maximin (FR)

(73) Assignee: STMICROELECTRONICS (ROUSSET) SAS, Rousset (FR)

(*) Notice: Subject to any disclaimer, the term of this patent is extended or adjusted under 35 U.S.C. 154(b) by 0 days.

(21) Appl. No.: 16/540,954

(22) Filed: Aug. 14, 2019

(65) Prior Publication Data
US 2020/0067503 A1 Feb. 27, 2020

(30) Foreign Application Priority Data
Aug. 23, 2018 (FR) .................. 18 57620

(51) Int. Cl.
H03K 17/0812 (2006.01)
H03K 17/12 (2006.01)

(52) U.S. Cl.
CPC ..... H03K 17/08122 (2013.01); H03K 17/122 (2013.01)

(58) Field of Classification Search
CPC .......... H03K 17/08122; H03K 17/122; G01R 31/40; G01R 31/2831; G01R 31/27; G01R 31/2621
See application file for complete search history.

(56) References Cited

U.S. PATENT DOCUMENTS

| 5,351,162 A * | 9/1994 | Koishikawa ..... H03K 17/08122 307/39 |
| 8,957,724 B2 * | 2/2015 | Pavlin ..................... G05F 1/46 327/427 |
| 9,444,374 B2 * | 9/2016 | Muhlbauer ............ H02M 1/088 |
| 10,523,103 B2 * | 12/2019 | Butzmann ............ H03K 17/167 |
| 2002/0145453 A1 | 10/2002 | Joerg |
| 2004/0252430 A1 | 12/2004 | Oumaru et al. |
| 2010/0052647 A1 * | 3/2010 | Forghani-zadeh ..... H02H 9/025 323/349 |
| 2018/0048256 A1 * | 2/2018 | Schwarzkopf .......... H02P 29/50 |

FOREIGN PATENT DOCUMENTS

EP 1189349 A1 3/2002
EP 3010128 A1 4/2016

* cited by examiner

Primary Examiner — Kyle J Moody
(74) Attorney, Agent, or Firm — Slater Matsil, LLP

(57) ABSTRACT

In one embodiment, a circuit includes a plurality of elementary transistors connected in parallel between a node of application of a first potential of a power supply voltage and a node for coupling a load. The plurality of transistors includes a first assembly of elementary transistors having their gates coupled to a control node by a first circuit and a second assembly of elementary transistors having their gates coupled to the control node by a second circuit. The second circuit has two states, where the first and second circuits are configured to supply a substantially identical control voltage to the gates of the first and second assemblies of elementary transistors when the second circuit is in one of the two states.

20 Claims, 2 Drawing Sheets

ELECTRONIC CIRCUIT

CROSS-REFERENCE TO RELATED APPLICATIONS

This application claims priority to French Patent Application No. 1857620, filed on Aug. 23, 2018, which application is hereby incorporated herein by reference.

TECHNICAL FIELD

The present disclosure concerns electronic circuits, and more particularly circuits comprising power transistors.

BACKGROUND

During the manufacturing of electronic circuits, tests are performed to verify the integrity of the circuits. Certain tests are performed full plate, during the circuit manufacturing, and others are performed at the end of the manufacturing, that is, after the assembly of the different portions of the final circuit, including the packaging.

SUMMARY

An embodiment overcomes all or part of the disadvantages of usual electronic circuits.

An embodiment provides a circuit comprising a plurality of elementary transistors connected in parallel between a node of application of a first potential of a power supply voltage and a load, the plurality of transistors comprising a first assembly of elementary transistors having their gates coupled to a control node by a first circuit, and at least one second assembly of elementary transistors having their gates coupled to the control node by a second circuit, the second circuit having two states, the first and second circuits being capable of supplying a substantially identical control voltage to the gates of the first and second assemblies of elementary transistors when the second circuit is in one of the two states.

According to an embodiment, the surface area ratio between the first assembly of elementary transistors and the plurality of elementary transistors is substantially greater than 5.

According to an embodiment, the first and second circuits are switches.

According to an embodiment, the first and second circuits have substantially the same impedance when they are on.

According to an embodiment, the first and second circuits are MOS transistors.

According to an embodiment, the gate/source voltages of the first and second circuits are substantially identical in operation.

According to an embodiment, the first circuit is an on switch.

According to an embodiment, the circuit comprises a third assembly of elementary transistors.

According to an embodiment, the circuit comprises a third assembly of elementary transistors.

According to an embodiment, during a test, the first assembly is the only assembly of elementary transistors connected to the control node.

Another embodiment provides a method of testing an electronic circuit such as previously described, during which a current flows through the first assembly of elementary transistors.

According to an embodiment, the current is applied under a probe.

According to an embodiment, the current is greater than 2 A.

According to an embodiment, the current does not flow through at least a second assembly of elementary transistors.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
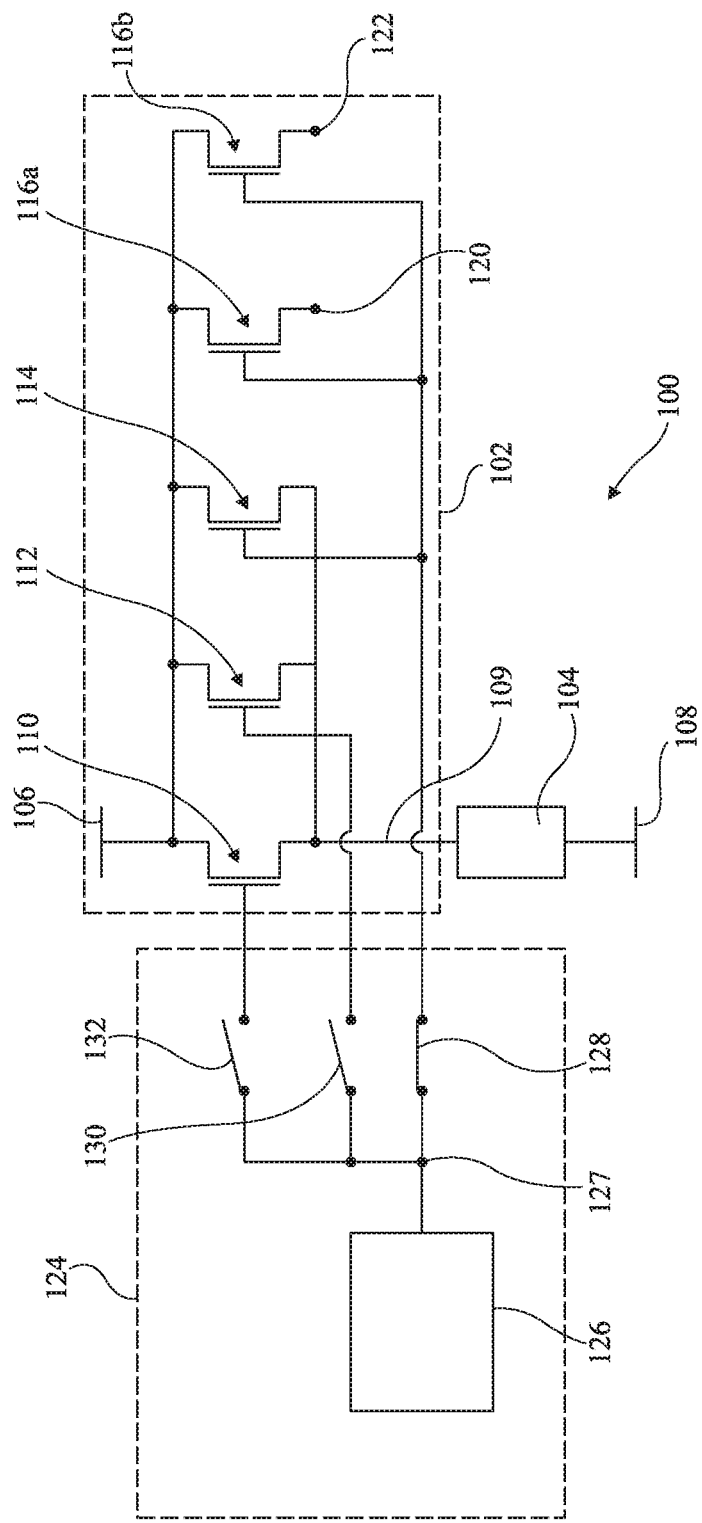
FIG. 1 schematically shows an embodiment of an electronic circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the concerned elements in the drawings.

The terms "about", "substantially", and "approximately" are used herein to designate a tolerance of plus or minus 10%, preferably of plus or minus 5%, of the value in question.

Figure 2:
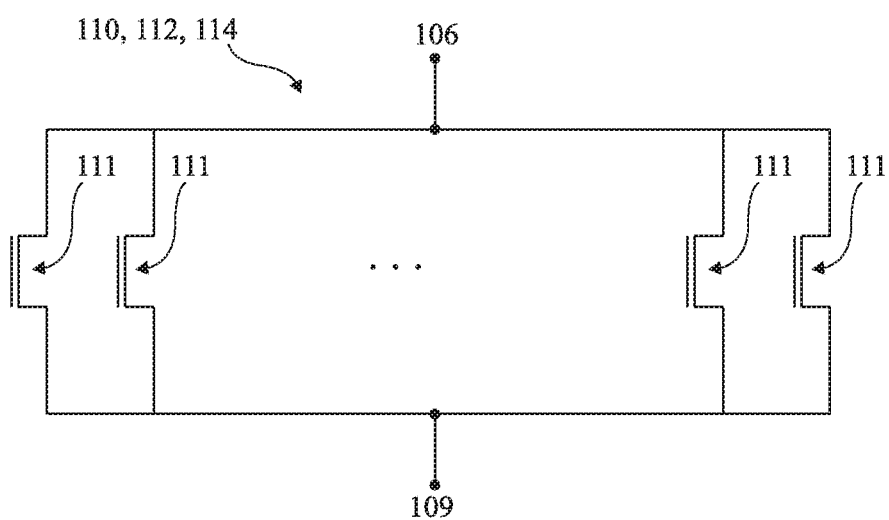
FIG. 2 schematically shows a portion of the circuit of FIG. 1.

FIG. 1 schematically shows an embodiment of an electronic circuit 100. FIG. 2 schematically shows a portion of the circuit of FIG. 1.

Circuit 100 comprises a power transistor 102 series coupled with a load 104 between a node 106 of application of a first potential of a power supply voltage and a node 108 of application of a second potential of this voltage. The second potential corresponds to a reference potential, for example, the ground. More particularly, transistor 102 is connected between node 106 and a node 109, and load 104 is connected between node 109 and node 108.

Power transistor designates a transistor capable of conducting significant currents, for example, greater than 5 A.

Transistor 102 comprises transistors 110, 112, and 114 connected in parallel between node 106 and 109.

FIG. 2 shows one of transistors 110, 112, or 114 of FIG. 1. Transistors 110, 112, and 114 each comprise an assembly of identical elementary transistors 111, connected in parallel between nodes 106 and 109. The gates of the elementary transistors of a same assembly are connected to a same node corresponding to the gate of transistor 110, 112, or 114.

According to a preferred embodiment, transistor 110 comprises a number of elementary transistors greater than the number of elementary transistors of each transistor 112, 114. Transistor 112 for example comprises a number of elementary transistors greater than the number of elementary transistors of transistor 114. For example, the surface area ratio, between the assembly of elementary transistors forming transistor 102 and the plurality of elementary transistors forming transistor 114, is substantially greater than 5, preferably greater than 5.

Circuit 100 further comprises a circuit 124 for controlling transistor 102. Control circuit 124 comprises a charge pump 126 supplying, on a control node 127, a signal for controlling transistor 102.

Circuit 100 further comprises switches 128, 130, and 132, for example in control circuit 124. Switches 128, 130, 132 are respectively coupled between the output of charge pump 126 and the gate of transistors 114, 112, 110. Preferably, switch 128 is still on (conductive). The impedances of switches 128, 130, and 132 are for example substantially equal to or inversely proportional to the surface areas of the transistors to which they are connected, when they are on. Thus, the switches have the same influence on the different assemblies of elementary transistors. In particular, the presence of switch 128, similar to switches 130 and 132, as opposed to the presence of a connection element such as a conductive wire, enables to ensure that, by forming switches 128, 130, and 132 with transistors, the on-state resistance of all transistors is substantially the same. More generally, the impedances of switches 128, 130, and 132 are selected in such a way that the R*C products of transistors 110, 112, and 114, where R is the resistance of switch 128, 130, or 132 in the on state and C is the gate capacitance of transistor 110, 112, or 114, have substantially the same value. This results in substantially identical, preferably identical, gate voltages, and thus gate-source voltages, for all transistors, and thus in substantially identical on-state resistances, and thus substantially identical currents in each elementary transistor.

In a first operating mode of circuit 100, which for example corresponds to the usual operating mode of power transistor 102, switches 128, 130, and 132 are on. All the transistors of transistor 102 are thus controlled by the signal supplied by charge pump 126.

In a second operating mode of circuit 100, switch 132 is off and switches 128 and 130 are on. The gate of transistor 110 thus does not receive the control signal. Transistor 102 thus operates as a transistor comprising a smaller number of elementary transistors than transistor 102 in the first operating mode and thus withstands smaller currents than transistor 102 in the first operating mode.

In a third operating mode of circuit 100, switches 130 and 132 are off and switch 128 is on. The gates of transistors 110 and 112 thus do not receive the control signal.

Transistor 102 may comprise elementary transistors 116 enabling to obtain information relative to its operation, two of which, 116a and 116b, are shown in FIG. 1. Each of transistors 116a and 116b is coupled between node 106 and a node 120 or 122. The voltages on nodes 120 and 122 are used to obtain data representative of the state of transistor 102. The gates of transistors 116a and 116b are connected to the gate of transistor 114. Transistors 116a and 116b are thus controlled by the same control signal as transistor 114.

Transistors 116a and 116b are however not perfectly representative of the operation of transistor 102. Indeed, transistors 116a and 116b are connected between nodes 106 and 109 and are not connected to load 104. Certain test should thus be performed on the other transistors which are coupled between nodes 106 and 108, that is, in series with load 104.

For example, tests are performed on circuits comprising power transistors, during which a first voltage is supplied to the control node and a second voltage is supplied to the power supply node to conduct a significant current, for example, greater than 2 A, through the transistor. Certain characteristics of the transistors are then measured. For example, the current may be measured at the level of node 109. Although such tests are performed on components formed on a same plate, the tests are generally performed at the end of the manufacturing, on each complete device. Indeed, the probes used to perform the probe tests during the manufacturing cannot withstand the heat generated by significant currents, such as those used to test a power transistor.

The embodiment of FIG. 1 is compatible with such a probe test. Indeed, the inventors have determined that the results of such a test performed on transistor 114 are representative of the results of this same test on transistor 102 if the current density is the same during the two tests. In other words, the ratio of the currents flowing through the two transistors is substantially equal to the surface area ratio between transistors 114 and 102.

The test performed on transistor 114 is performed in the third operating mode. Thus, switches 130 and 132 are off. The measured current is thus much smaller than the current of the application.

For example, a test may be performed on circuit 100 in the third operating mode by applying, to the control node, a control signal and, to node 106, a voltage such that the current in transistor 114 reaches 2 A. This test is representative of the current flowing through transistor 102 in operation (first and second operating mode) with a proportionality coefficient corresponding to the surface area ratio between transistors 102 and 114.

As a variation, transistor 102 may only comprise two assemblies of elementary transistors, transistor 114, coupled to the control node by on transistor 128, and one transistor coupled to the control node by a transistor which may be off or on and comprising the elementary transistors of transistors 110 and 112. Circuit 100 then only comprises two operating modes, a first mode, for example, a usual operating mode, where the two switches are on, and a second mode, corresponding to the third previously-described operating mode, where switch 128 is on and the other switch is off. The second mode is the test mode.

Transistor 102 may also comprise more than three assemblies of elementary transistors coupled between node 106 and node 109, each assembly being coupled to control node 127 via a switch.

As a variation, switches 128, 130, and 132 may be replaced with other circuits connecting in the same way transistors 110, 112, and 114 to control node 127. More particularly, the circuits enable to controllably connect the gates of transistors 110 and 112 to control node 127 and enable to connect the gate of transistor 114 to control node 127. The circuits coupled to the transistors other than transistor 114 for example have 2 states, for example, similar to the on (conductive) and off (non-conductive) states of switches 130 and 132. The circuits are capable of supplying, when they are in the state similar to the on state, a substantially identical control voltage to the gates of the assemblies of elementary transistors. For example, the circuits have the same impedance.

Preferably, circuit 100 comprises elements enabling to balance the gate voltages to ensure that the different assemblies of elementary transistors receive identical control signals during the operation. Such elements are within the abilities of those skilled in the art.

An advantage of the embodiments described herein is that certain tests can be performed under probes on power transistors during the manufacturing. It is thus possible to determine the defective circuits before the end of the manufacturing and to thus decrease production costs.

Another advantage to the embodiments described herein is that the considered tests on power transistors consume less current.

Various embodiments and variations have been described. These various embodiments and variations may be combined and other variations will occur to those skilled in the art. In particular, although, in the disclosure, it is considered that transistor 110 comprises more elementary transistors than transistor 112, and that transistor 112 comprises more elementary transistors than transistor 114, the number of elementary transistors in the different assemblies of elementary transistors may be selected otherwise, as long as the number of elementary transistors of transistor 114 is adapted to the current density of the test to be carried out. Finally, the practical implementation of the described embodiments and variations is within the abilities of those skilled in the art based on the functional indications given here-above.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit comprising:
a first plurality of elementary transistors connected in parallel between a node of application of a first potential of a power supply voltage and a node for coupling a load, the first plurality of elementary transistors comprising a first assembly of elementary transistors having gates coupled to a control node by a first circuit and a second assembly of elementary transistors having gates coupled to the control node by a second circuit, the second circuit having two states, the first and second circuits being configured to supply a substantially identical control voltage to the gates of the first and second assemblies of elementary transistors when the second circuit is in one of the two states; and
a second plurality of elementary transistors coupled to the node of application of the first potential of the power supply voltage, a control node of each of the second plurality of elementary transistors coupled to the control node by the first circuit, and a third node of each second plurality of elementary transistors coupled to a corresponding test node of the circuit.

2. The circuit of claim 1, wherein a surface area ratio between the first plurality of elementary transistors and the first assembly of elementary transistors is substantially greater than 5.

3. The circuit of claim 1, wherein the first and the second circuits are switches.

4. The circuit of claim 3, wherein the first and the second circuits have substantially the same impedance when the first and second circuits are on.

5. The circuit of claim 3, wherein the first and the second circuits are MOS transistors.

6. The circuit of claim 5, wherein gate to source voltages of the first and the second circuits are substantially identical in operation.

7. The circuit of claim 1, wherein the first circuit is an on switch.

8. The circuit of claim 1, further comprising a third assembly of elementary transistors.

9. The circuit of claim 8, wherein the third assembly of elementary transistors is coupled to the node of application of a control signal by a third circuit configured to supply a control voltage substantially identical to the substantially identical control voltages supplied by the first and the second circuits.

10. The circuit of claim 1, wherein, during a test, the first assembly and the second plurality of elementary transistors are configured to be connected to the control node, and the second assembly is configured to be disconnected from the control node.

11. A circuit comprising:
a first assembly of elementary transistors connected in parallel between a power supply voltage node and a node for coupling a load;
a second assembly of elementary transistors connected in parallel between the power supply voltage node and the load, the second assembly of elementary transistors having less number of elementary transistors than the first assembly of elementary transistors;
a first circuit coupling gates of the first assembly of elementary transistors with a control node;
a second circuit coupling gates of the second assembly of elementary transistors with the control node;
a first current path between the control node through the first circuit to the first assembly of elementary transistors; and
a second current path between the control node through the second circuit to the second assembly of elementary transistors, wherein a first impedance of the first circuit through the first current path is inversely proportional to surface areas of the first assembly of elementary transistors, and wherein a second impedance of the second circuit through the second current path is inversely proportional to surface areas of the second assembly of elementary transistors.

12. The circuit of claim 11, wherein a surface area ratio between the surface areas of the first and the second assemblies of elementary transistors and the surface areas of the first assembly of elementary transistors is substantially greater than 5.

13. The circuit of claim 11, wherein the first and the second circuits are switches.

14. The circuit of claim 11, wherein the first circuit is configured to supply a first control voltage to the first assembly of elementary transistors, wherein the second circuit is configured to supply a second control voltage to the second assembly of elementary transistors, and wherein the first control voltage is substantially identical to the second control voltage.

15. The circuit of claim 1, further comprising:
a third assembly of elementary transistors;
a third circuit coupling gates of the third assembly of elementary transistors with the control node; and
a third current path between the control node through the third circuit to the third assembly of elementary transistors, wherein a third impedance of the third circuit through the third current path is inversely proportional to surface areas of the third assembly of elementary transistors.

16. The circuit of claim 15, wherein the third circuit is configured to supply a third control voltage substantially identical to the first and the second control voltages.

17. A method of testing comprising:
- having an electronic circuit comprising:
  - a first plurality of elementary transistors connected in parallel between a node of application of a first potential of a power supply voltage and a node for coupling to a load, the first plurality of elementary transistors comprising a first assembly of elementary transistors having gates coupled to a control node by a first circuit and a second assembly of elementary transistors having gates coupled to the control node by a second circuit, the second circuit having two states, the first and second circuits being configured to supply a substantially identical control voltage to the gates of the first and second assemblies of elementary transistors when the second circuit is in one of the two states, and
  - a second plurality of elementary transistors coupled to the node of application of the first potential of the power supply voltage, a control node of each of the second plurality of elementary transistors coupled to the control node by the first circuit, and a third node of each second plurality of elementary transistors coupled to a corresponding test node of the electronic circuit; and
- flowing a current through the first assembly of elementary transistors and the second plurality of elementary transistors, wherein during the testing, the first assembly and the second plurality of elementary transistors are configured to be connected to the control node, and the second assembly is disconnected from the control node during the testing.

18. The method of claim 17, wherein the current is applied under probes.

19. The method of claim 17, wherein the current is greater than 2 A.

20. The method of claim 17, wherein no current flows through the second assembly of elementary transistors.

* * * * *